(12) United States Patent
Tang

(10) Patent No.: US 6,483,415 B1
(45) Date of Patent: Nov. 19, 2002

(54) MULTI-LAYER LC RESONANCE BALUN

(75) Inventor: Ching-Wen Tang, Nan-Tou (TW)

(73) Assignee: Industrial Technology Research Institute, Hsinchu (TW)

( * ) Notice: Subject to any disclaimer, the term of this patent is extended or adjusted under 35 U.S.C. 154(b) by 9 days.

(21) Appl. No.: 09/861,744

(22) Filed: May 21, 2001

(51) Int. Cl.[7] .............................................. H01F 5/00
(52) U.S. Cl. ...................... 336/200; 336/223; 336/232; 333/26
(58) Field of Search ..................... 333/33, 26; 336/200, 336/223, 232

(56) References Cited

U.S. PATENT DOCUMENTS

| | | | | |
|---|---|---|---|---|
| 5,061,910 A | * | 10/1991 | Bouny | 333/26 |
| 5,455,545 A | | 10/1995 | Garcia | 333/26 |
| 5,497,137 A | | 3/1996 | Fujiki | 336/200 |
| 5,611,272 A | * | 3/1997 | Steuer | 101/23 |
| 5,697,088 A | * | 12/1997 | Gu | 455/307 |
| 5,886,589 A | * | 3/1999 | Mourant | 333/26 |
| 6,150,897 A | * | 11/2000 | Nishikawa et al. | 333/26 |
| 6,278,340 B1 | * | 8/2001 | Liu | 333/26 |

\* cited by examiner

*Primary Examiner*—Anh Mai

(57) ABSTRACT

A multi-layer LC resonance balun includes at least a section of broadside coupled lines connected to an input port and two balanced output ports through transmission lines. Each section of coupled lines has two coupled lines. The first embodiment has at least two sections of coupled lines connected to a transmission line and coupled in parallel with at least one capacitor. The coupled lines are connected to an input port and two balanced output ports. The second embodiment has at least a section of coupled lines coupled in parallel with capacitors and then connected to an input port and two balanced output ports through transmission lines. By means of a multiple layer dielectric structure and meandered coupled lines, the size of the blaun is decreased and the frequency bandwidth is increased.

21 Claims, 15 Drawing Sheets

MULTI-LAYER LC RESONANCE BALUN

FIELD OF THE INVENTION

The present invention generally relates to a balance-to-unibalance transformer (blaun) used in a wireless local network or personal communication, and more specifically to a multi-layer LC resonance balun that can be fabricated as a device in a micro-chip.

BACKGROUND OF THE INVENTION

A balun is a device for converting signals between an unbalanced circuit structure and a balanced circuit structure. The signal of a balanced circuit structure comprises two signal components with same magnitude but 180-degree phase difference. Many analog circuits require balanced inputs and outputs in order to reduce noise and high order harmonics as well as improve the dynamic range of the circuits.

There are several types of baluns that are either active or passive. Passive baluns can be classified as lumped-type, coil-type and distributed-type baluns. A lumped-type balun uses lumped capacitors and inductors to match impedance and generate two balanced signals with same magnitude and 180-degree phase difference. The advantages of a lumped-type balun are small volume and light weight. However, it is not easy to maintain the 180-degree phase difference and the identical magnitude between the two signals.

Coil-type baluns have been widely used in lower frequency and ultra high frequency (UHF) bands. When a coil-type balates is used in higher than the UHF band, it usually has a drawback of having considerable loss. In addition, it has reached the limit of miniaturization and can not be further reduced in size.

Distributed-type baluns can further be classified as 180-degree hybrid and Marchand. A 180-degree hybrid balun has a fairly good frequency response in the microwave frequency band. However, its size often poses a problem when it is used in the radio frequency range between 200 MHz and several GHz. Because a 180-degree hybrid balun comprises a few sections of quarter wave transmission lines, it is difficult to reduce the size. Even if it is manufactured in a meandered way, a significant area is still required. One approach to reducing the size is to use a power divider along with a pair of transmission lines having different length for generating the 180-degree phase difference. Nevertheless, the size is still too large.

As shown in FIG. 1, a Marchand balun commonly used in the industry comprises two sections of quarter wave coupled lines. This type of baluns has a fairly large bandwidth. Both phase balance and power distribution of a Marchand balun are reasonably good. However, the transmission lines in a Marchand balun need to be tightly coupled in order to achieve a sufficient bandwidth. Therefore, a Marchand balun is often broadside coupled to reduce its area. It is also fabricated in a meandered way to minimize its size. The balun is commonly seen in an RF application. Using a high dielectric constant material can also reduce the size of a Marchband balun.

U.S. Pat. No. 5,497,137 discloses a chip-type transformer as shown in FIG. 2. The chip-type transformer comprises a laminate 200 formed by five dielectric substrates 214a–214e superimposed one on the other. A ground electrode 216 is formed on a main surface of the first dielectric substrate 214a. Another ground electrode 230 is formed on a main surface of the fifth dielectric substrate 214e. A connecting electrode 220 is formed on a main surface of the second dielectric substrate 214b.

There is a first strip line 222 on the third dielectric substrate 214c. The first strip line 222 comprises a first spiral portion 224a and a second spiral portion 224b that are electromagnetically coupled respectively to a second strip line 226 and a third strip line 228 formed on the fourth dielectric substrate 214d. The structure of the chip-type balun is broadside coupled and miniaturized by means of a high dielectric constant material. However, its size can not be reduced to a chip size if a low dielectric constant material is used.

SUMMARY OF THE INVENTION

This invention has been made to overcome the above-mentioned drawbacks of conventional baluns. The primary object is to provide a multi-layer balun having an equivalent circuit of an LC resonator. The equivalent circuit comprises at least a section of coupled lines, at least a transmission line and at least a capacitor. By means of the multi-layer structure and meandered coupled lines, the size of the balun of this invention is greatly reduced. In addition, the baluns can be realized with low dielectric constant materials to increase their stability.

According to this invention, the coupled lines of one of the embodied baluns have a symmetric structure with respect to a center geometrically. Both responses of magnitude and phase are well balancing. By adjusting the length of the coupled lines and the capacitance values, the impedance at the balanced output ports can be properly matched.

In a first embodiment, the equivalent circuit of the LC resonance balun comprises two sections of coupled lines connected to a transmission line trimming section and a parallel capacitor. By increasing the capacitance value of the parallel capacitor, the size of the balun can be reduced. Using a multi-layer structure, the capacitor may be fabricated on dielectric layers below or above the coupled lines. A vertically stacked multi-layer structure greatly reduces the size of the balun.

In a second embodiment, the equivalent circuit of the blaun comprises a section of coupled lines connected in parallel with two capacitors. The two ends of coupled lines are connected to an input port and two balanced output ports through transmission lines. The equivalent length of one LC resonator connected to the input port is shorter than a quarter of the wavelength. The equivalent length of the other LC resonator connected to the output ports is shorter than a half of the wavelength.

In the preferred embodiments of this invention, multiple sections of coupled lines can be incorporated. The coupled lines are manufactured with winding lines such as spiral lines, meandered lines, sinusoidal lines or saw-tooth lines. By means of winding lines, the area of the coupled lines is reduced. Multiple capacitors can also be used to increase the capacitance value. Based on the simulation, the balun of this invention shows that in a 200 MHz frequency bandwidth centered at 2.44 GHz, the magnitude difference is less than 2 dB and the 180-degree phase difference is less than 5 degrees at the two balanced ports.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

FIG. 3b shows that multiple sections of coupled lines and multiple parallel capacitors are used to extend the circuit of FIG. 3a.

FIG. 4b shows that multiple sections of coupled lines and multiple parallel capacitors are used to extend the circuit of FIG. 4a.

FIG. 7 illustrates a multi-layer structure of a balun having the equivalent circuit of FIG. 4a.

FIG. 8a shows the simulated results for the insertion loss and return loss of the equivalent circuit shown in FIG. 4a.

FIG. 8b shows the simulated results for the magnitude and phase differences at the balanced output ports of the equivalent circuit shown in FIG. 3a.

FIG. 9a shows the simulated results for the insertion loss and return loss of the equivalent circuit shown in FIG. 4a.

FIG. 9b shows the simulated results for the magnitude and phase differences at the balanced output ports of the equivalent circuit shown in FIG. 4a.

DETAILED DESCRIPTION OF THE PREFERRED EMBODIMENTS

Figure 1:
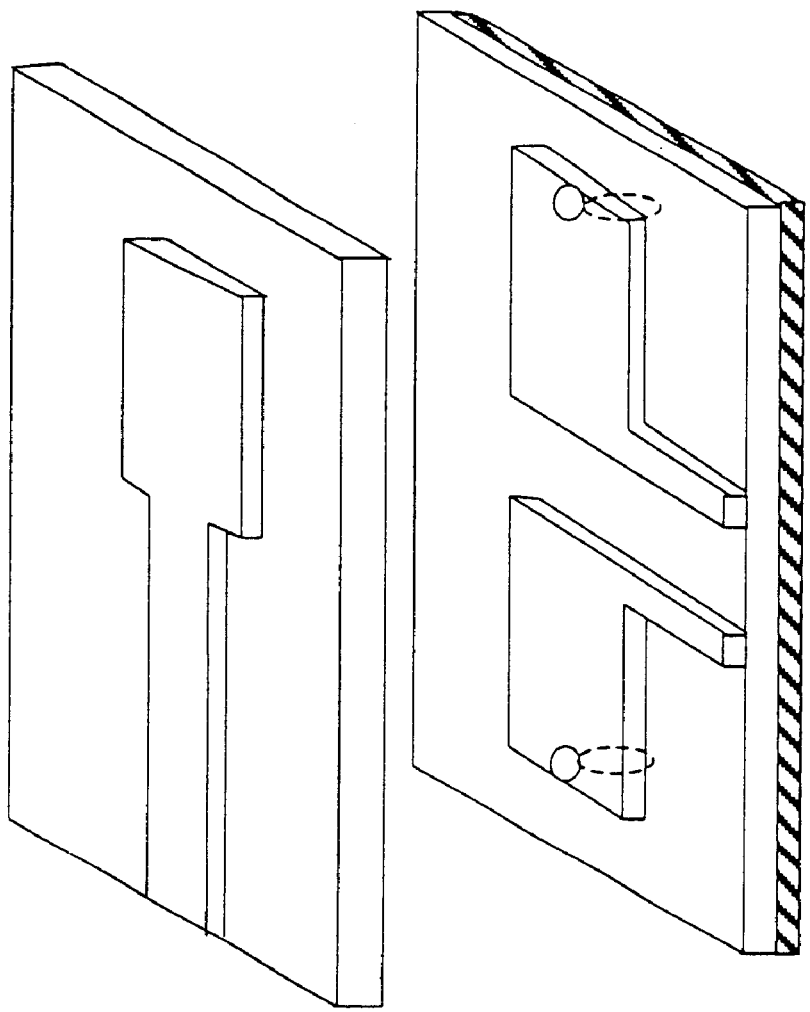
FIG. 1 shows a schematic diagram of a conventional Marchand balun.
Figure 2:
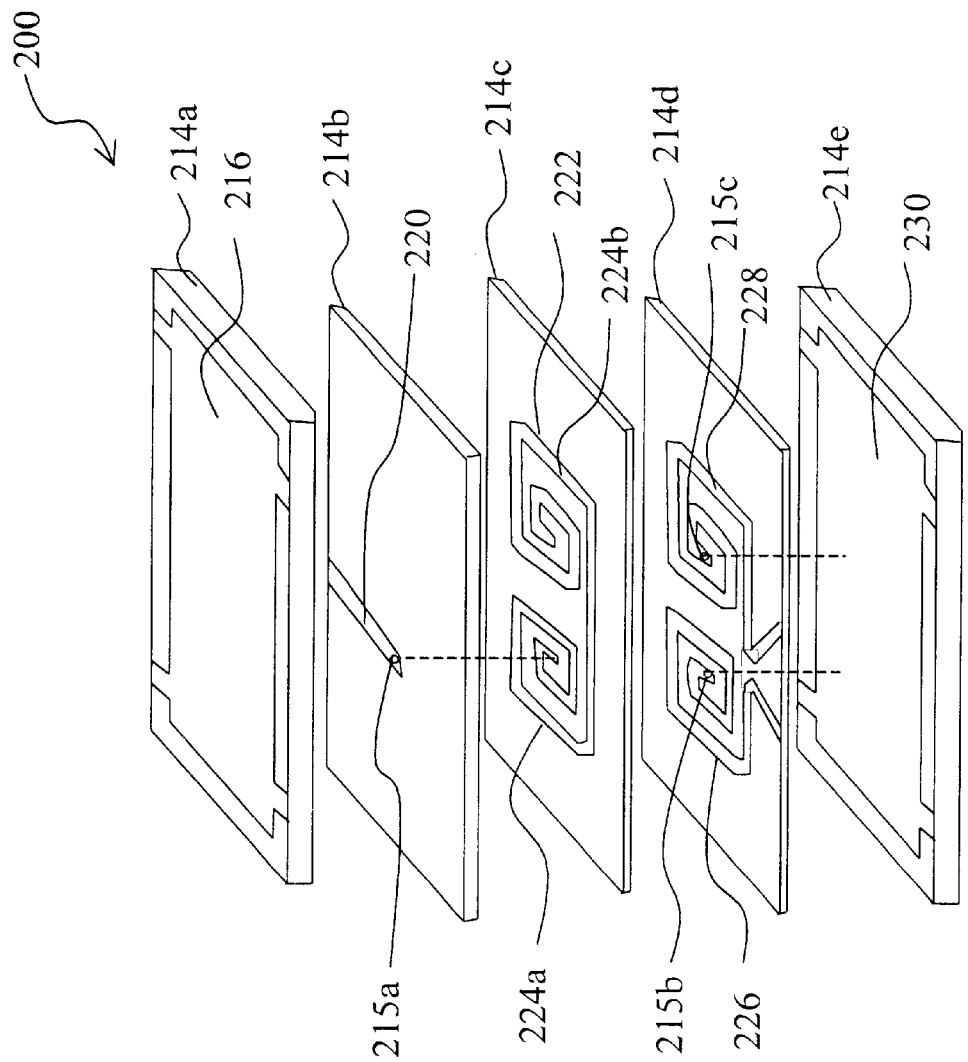
FIG. 2 shows a conventional chip-type balun.
Figure 3A:
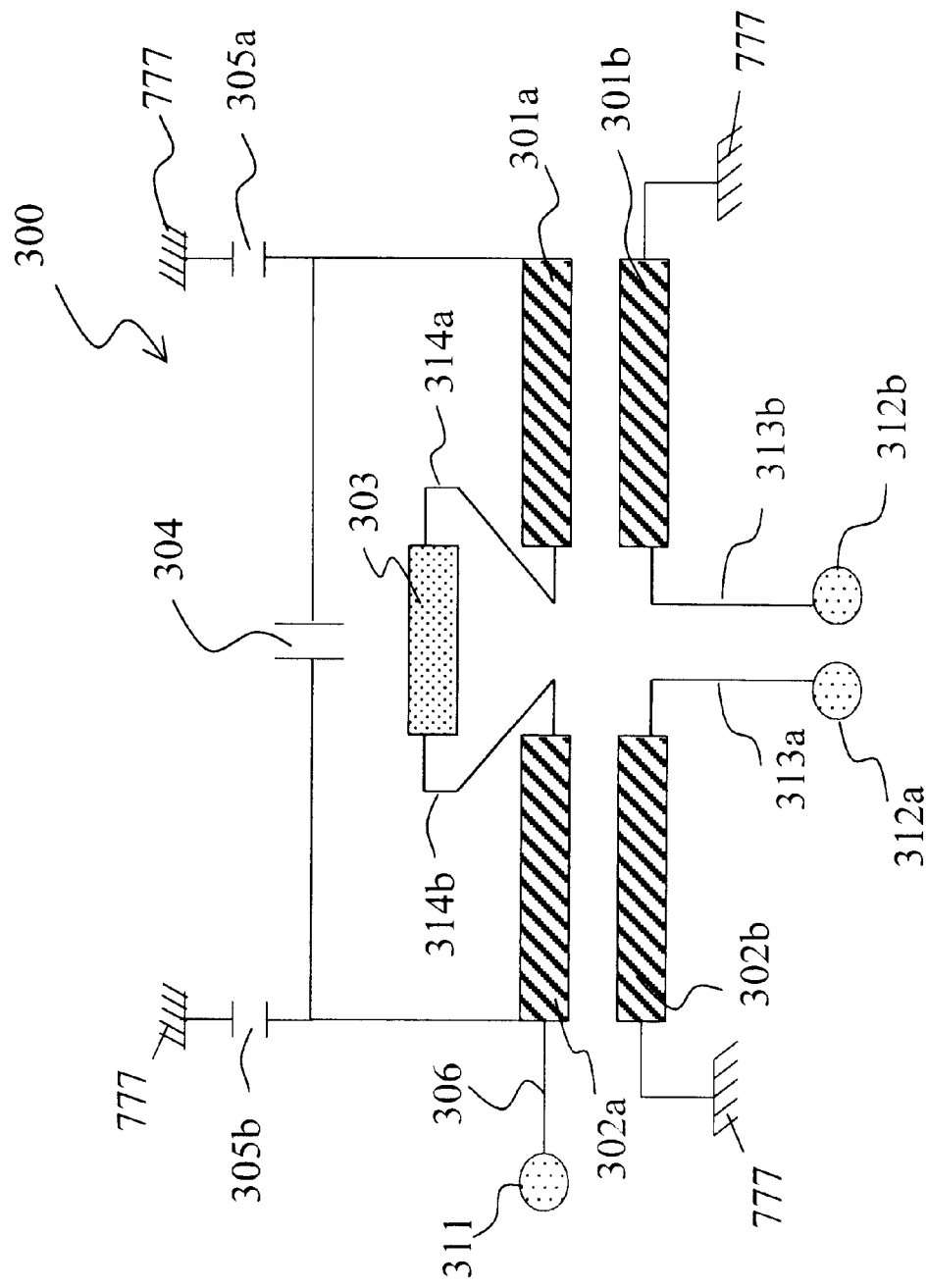
FIG. 3a shows an equivalent circuit of the LC resonance balun according to the first embodiment of this invention.

FIG. 3a shows the equivalent circuit of the LC resonator 300 of an LC resonance balun according the first embodiment to this invention. The equivalent circuit comprises two sections of broadside coupled lines 301 and 302 that are much shorter than a quarter of the wavelength, a trimming section of transmission line 303 and a capacitor 304 connected in parallel.

The first section of broadside coupled lines includes two coupled lines 301a and 301b, and the second section of broadside coupled lines includes two coupled lines 302a and 302b. Coupled line 301b has one end connected to the ground 777 and the other end connected through a metal line 313b to a first balanced port 312b. Similarly, coupled line 302b has one end connected to the ground 777 and the other end connected through a metal line 313a to a second balanced port 312a.

The transmission line trimming section 303 has a first end connected through a strip line 314a to one end of the coupled line 301a, and a second end connected through a strip line 314b to one end of the coupled line 302a. An unbalanced port 311 which is connected to one end of a coupled line 302a through a strip line 306 is an input terminal. As shown in FIG. 3a, the coupled transmission lines have completely symmetric structures on two sides with respect to the center geometrically. Both phase and magnitude are well balanced at the balanced ports. By adjusting the capacitance of the capacitor 304 and the length of the coupled lines, the impedance at the balanced ports can be matched properly.

Because of the multi-layer structure, there are parasitic capacitances 305a and 305b between the embedded capacitor 304 and ground plane 777.

In practice, the broadside coupled lines in the first embodiment can be a symmetric or asymmetric structure. The transmission line trimming section 303 can be capacitive or inductive. In addition to increasing the balance between the balanced ports, it can also match the impedance between the balanced and unbalanced ports when the impedance of the balanced ports has a complex value. The LC resonator in this embodiment may also be extended to include multiple sections of broadside coupled lines and multiple capacitors connected in parallel as illustrated in FIG. 3b.

Figure 3B:
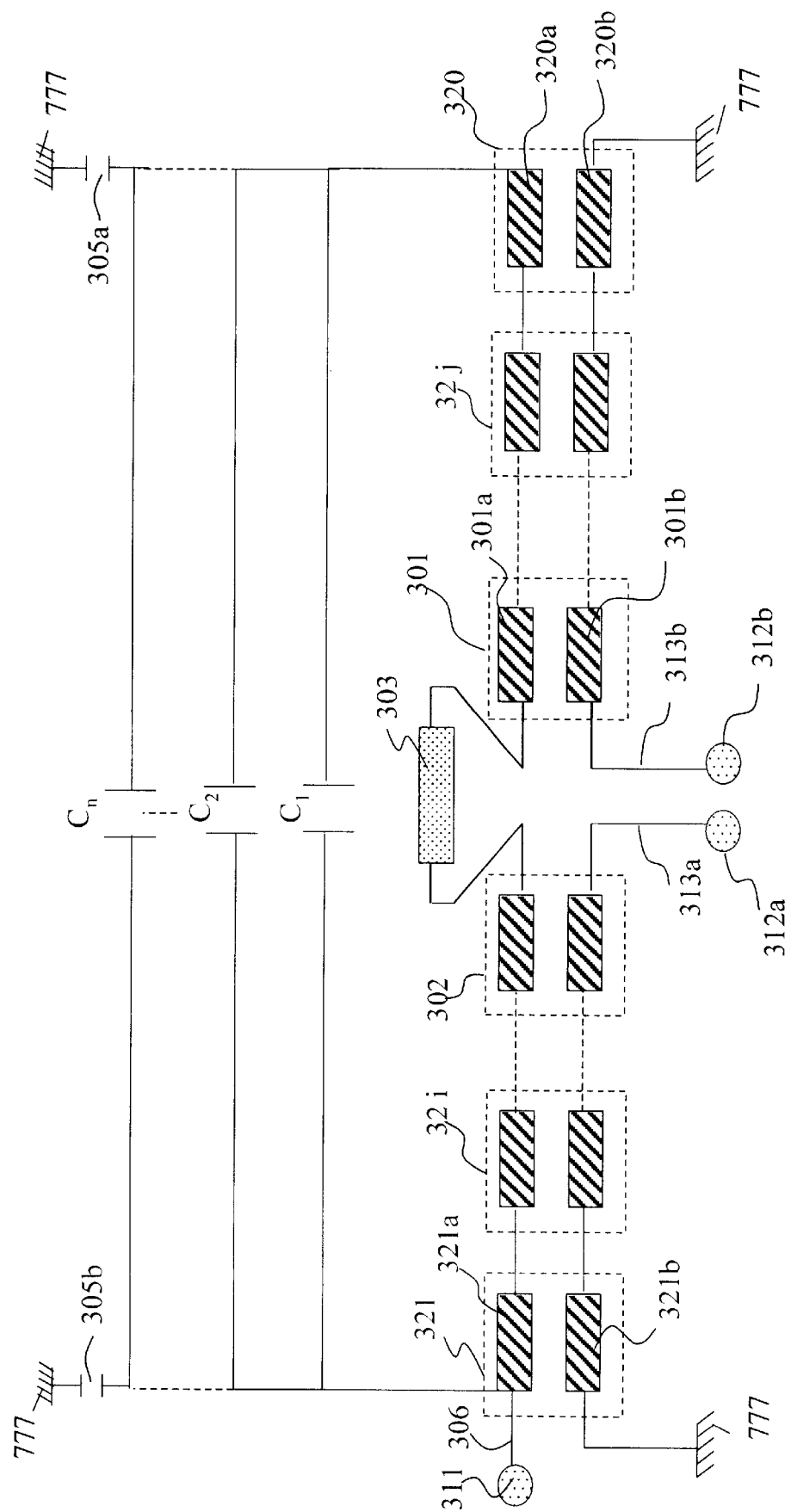

As can be seen in FIG. 3b, a plurality of sections of broadside coupled lines are connected to section 301 and section 302 on the two sides. Each section of coupled lines comprises first and second coupled lines. Each first coupled line of the middle sections 32i is connected in series, and each second coupled line of the middle sections 32i is connected in series on one side. The middle sections 32j on the other side are connected similarly.

The most left section 321 has its first coupled line 321a connected through the strip line 306 to the unbalanced port 311, and its second coupled line 321b connected to the ground 777. The first coupled line 321a is also connected to a plurality of parallel capacitors $C_f$–$C_n$ that are connected to the first coupled line 320a of the most right section 320. The second coupled line 320b of the most right section 320 is connected to the ground 777. Similar to the FIG. 3a, parasitic capacitances 305a and 305b also exist between these embedded parallel capacitors $C_f$–$C_n$ and ground plane 777.

According to this invention, by properly increasing the capacitance of the parallel capacitors in the equivalent circuit, the size of the device can be reduced. It is also possible to move half of the symmetric structure above the capacitors to form a structure which is also symmetric from top to bottom. The capacitors may be located above or below the coupled lines. The balanced ports may be formed in other dielectric layers by using via holes for connection. A symmetric structure extending upwards and downwards can be formed to take advantage of a multi-layer structure and to reduce the size of the balun significantly. Further detail will be described later with reference to FIGS. 6a and 6b.

Figure 4A:
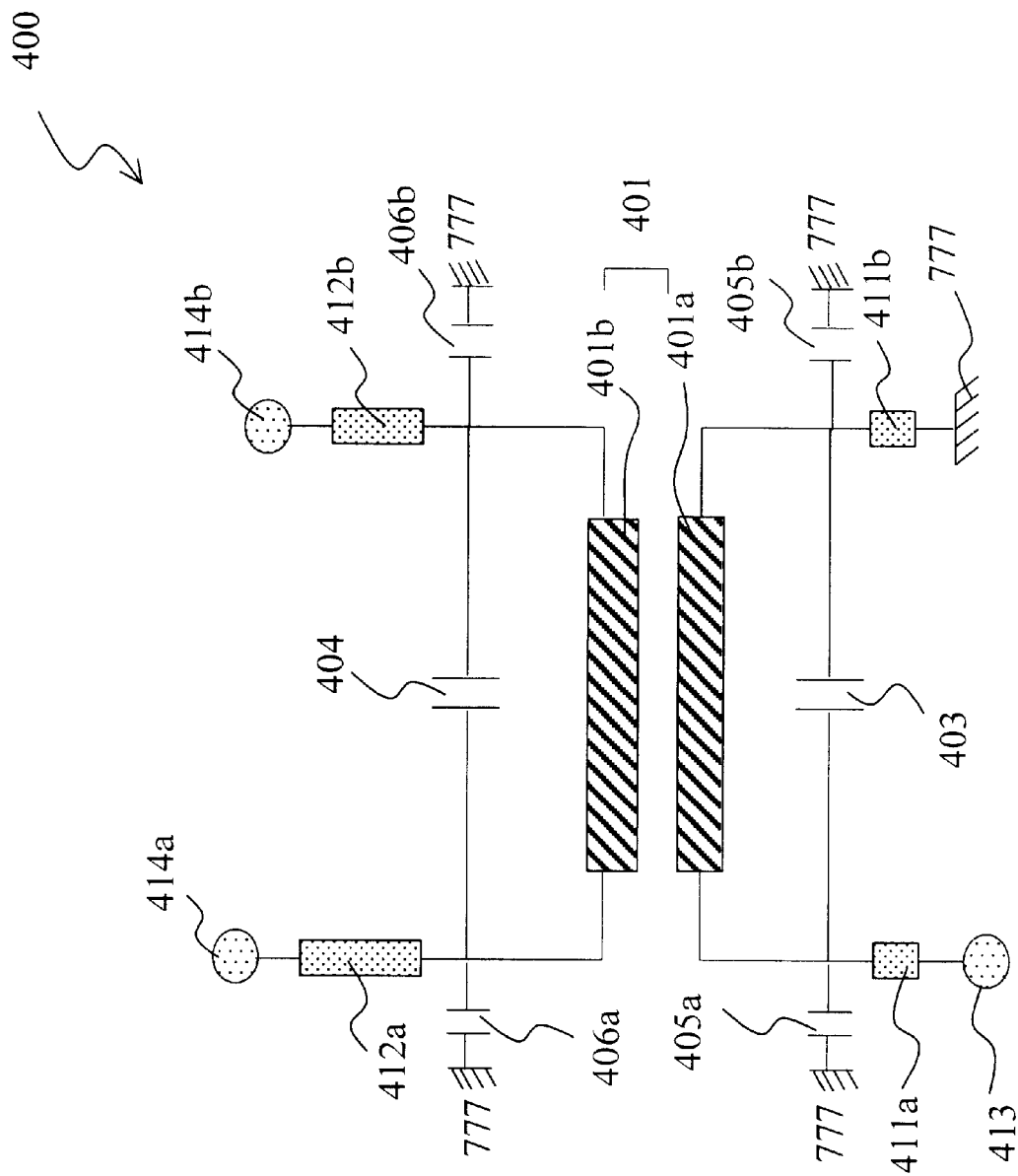
FIG. 4a shows an equivalent circuit of the LC resonance balun according to the second embodiment of this invention.

FIG. 4a shows the equivalent circuit of the LC resonator 400 of a second preferred embodiment of an LC resonance balun according to this invention. The equivalent circuit comprises a section 401 of two broadside coupled lines 401a and 401b, two capacitors 403 and 404 respectively connected in parallel with the two coupled lines 401a and 401b, and two pairs of transmission lines 411a, 411b, 412a and 412b.

Transmission line 401a of one LC resonator has one end connected to an unbalanced port 413 through the transmission line 411a, and the other end to the ground 777 through the transmission line 411b. The length of total transmission lines is smaller than a quarter of the wavelength. Two ends of transmission line 401b of the other LC resonator are connected to two balanced ports 414a and 414b through two transmission lines 412a and 412b respectively. The length of total transmission lines is smaller than one half of the wavelength. Because of the multi-layer structure, there are parasitic capacitances 405a, 405b and 406a, 406b among the embedded capacitors 403, 404 and ground plane 777.

By means of the theory of an LC resonator, the structure of the second embodiment can effectively reduce the size of the balun. The impedance matching as well as the balance of the phase and magnitude at the balanced ports can be achieved by properly designing the length of the two transmission lines 412a and 412b. Similar to the first embodiment, the broadside coupled lines may have a symmetric or asymmetric structure in realization. Moreover, multiple sections of coupled lines and multiple parallel capacitors may be used to extend the structure of this embodiment.

Figure 4B:
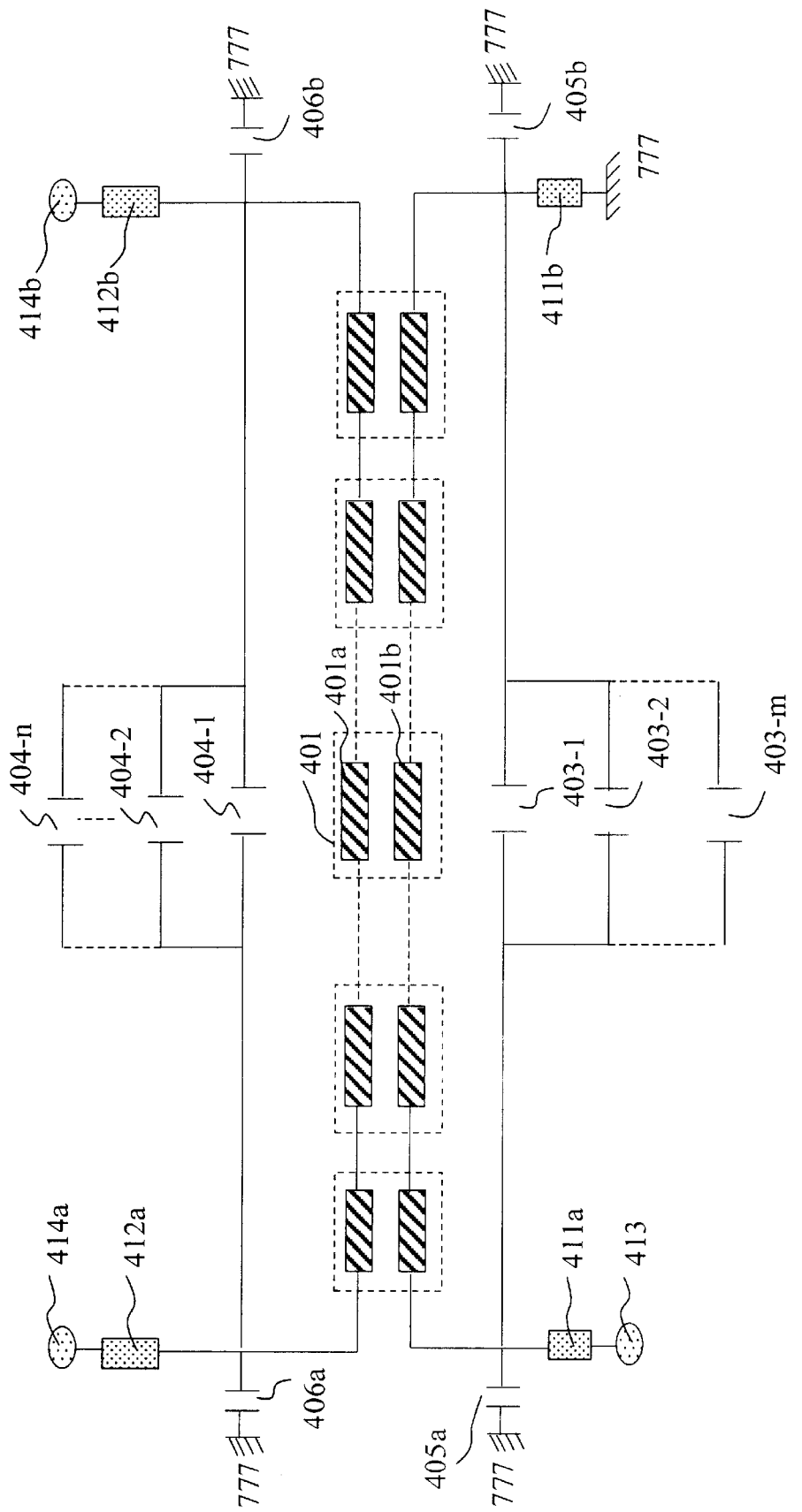
Figure 5B:
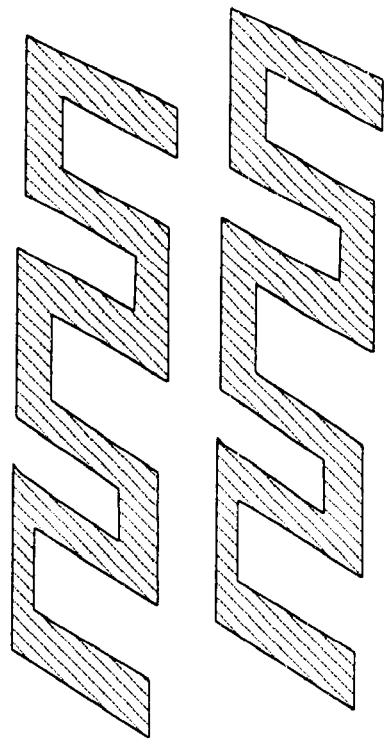
FIGS. 5a–5d illustrate four examples of winding lines for forming the coupled lines of this invention including spiral lines, meandered lines, sinusoidal lines and saws.
Figure 5A:
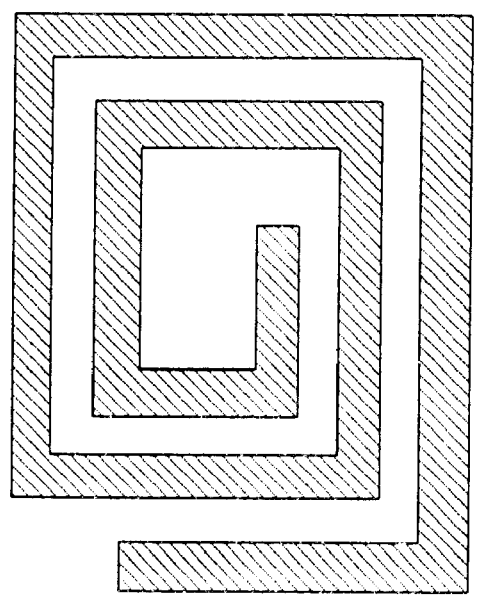
Figure 5D:
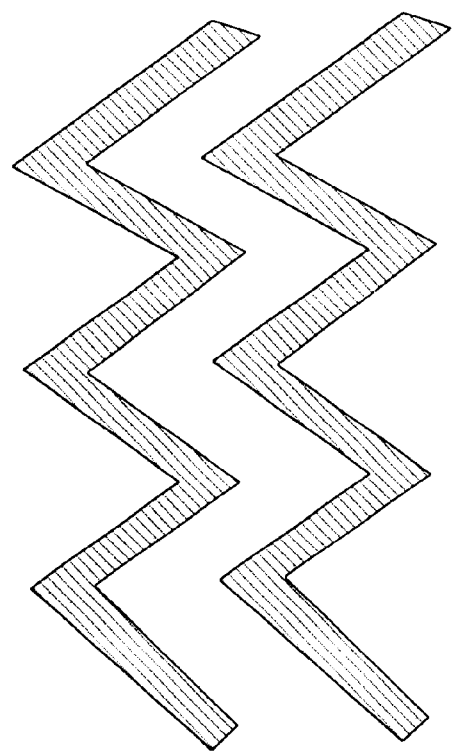
Figure 5C:
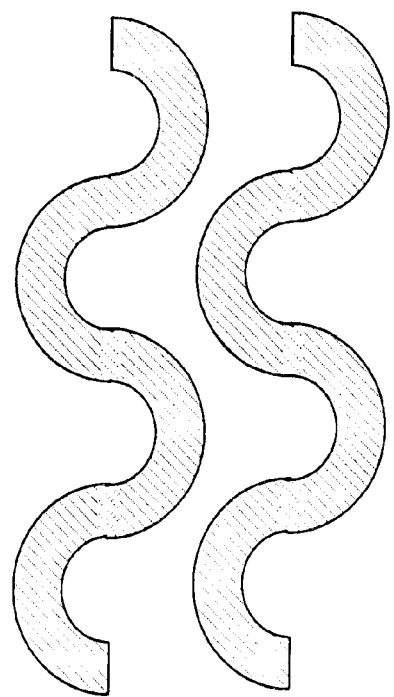

As shown in FIG. 4b, a plurality of sections of broadside coupled lines are connected to the two sides of the section 401. Each section of coupled lines comprises first and second coupled lines. Each first coupled line of the middle sections is connected in series, and each second coupled line of the middle sections is connected in series. The first coupled lines of the most right and left sections are connected through the transmission lines 412a and 412b to the balanced port 414a and 414b respectively. The second coupled line of the most left section is connected through the transmission line 411a to the unbalanced port 413. The second coupled line of the most right section is connected through the transmission line 411b to the ground 777. A plurality of capacitors 403-1, 403-2, . . . , 403-m and 404-1, 404-2, . . . , 404-n are connected in parallel with the plurality of sections of the broadside coupled lines. Similar to the FIG. 4a, parasitic capacitances 405a, 405b and 406a, 406b also exist among these embedded parallel capacitors 403-1, 403-2, . . . , 403-m, 404-1. 404-2, . . . , 404-n and ground plane 777.

In the preferred embodiments of this invention, the coupled lines may be formed by several different ways. FIGS. 5a–5d illustrate four different examples for the coupled lines including spiral lines, meandered lines, sinusoidal lines and saw-tooth lines. By means of these winding lines, the size of the balun can be reduced.

Figure 6A:
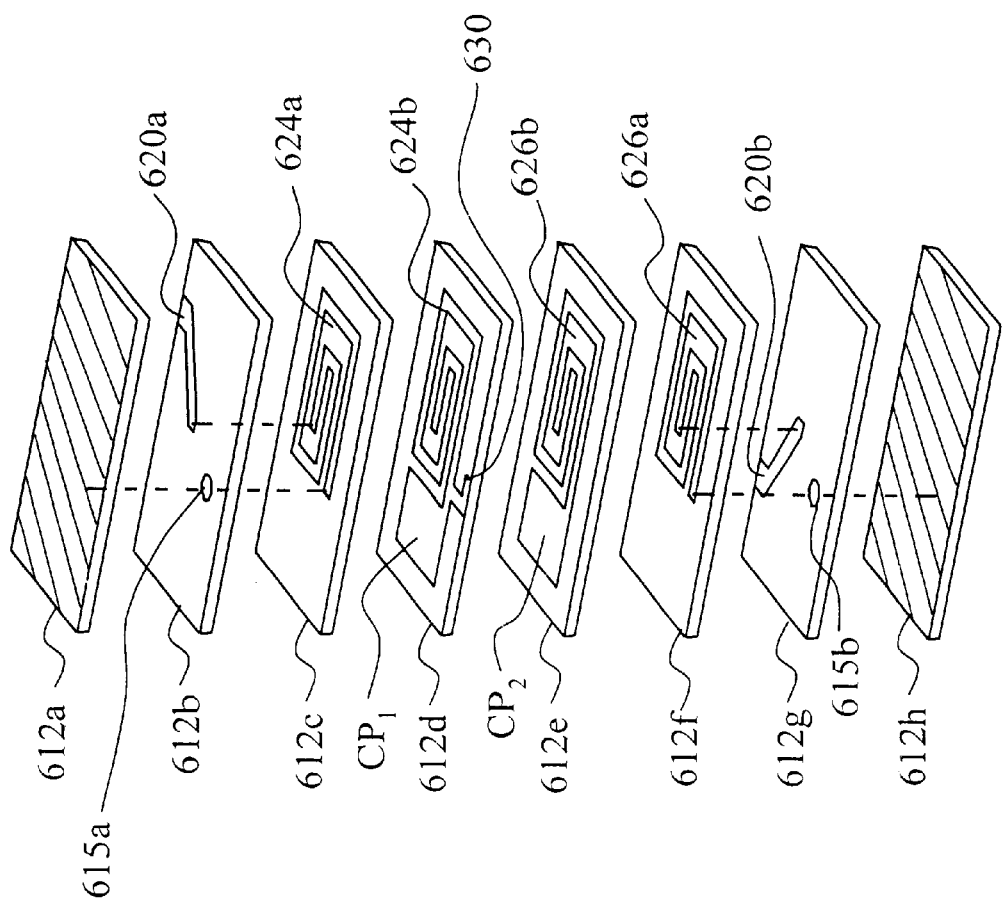
FIG. 6a illustrates a multi-layer structure of a balun having the equivalent circuit of FIG. 3a in which the parallel capacitor is located on the left side of the coupled lines.
Figure 6B:
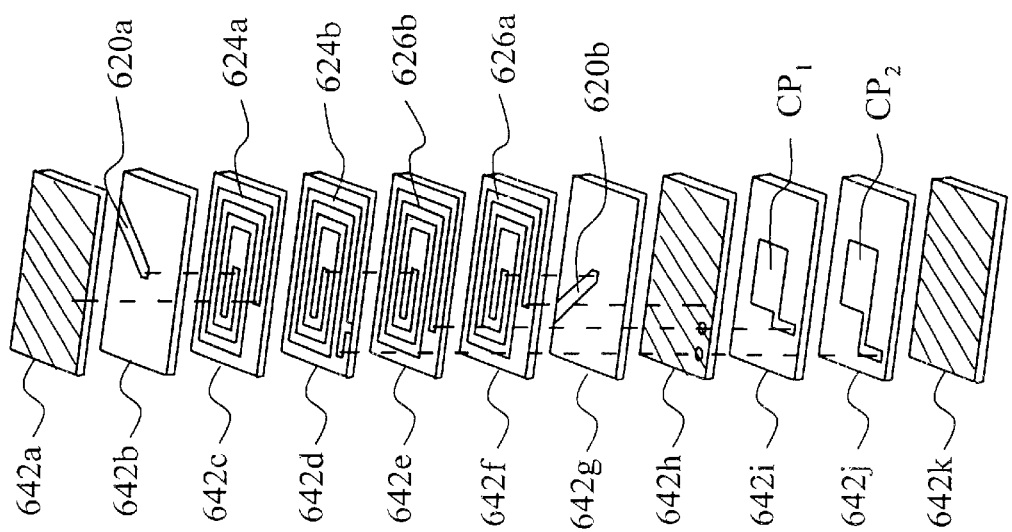
FIG. 6b illustrates a multi-layer structure of a balun having the equivalent circuit of FIG. 3a in which the parallel capacitor is located on separate dielectric layers below the coupled lines.

FIGS. 6a and 6b illustrate multi-layer device structures for baluns having equivalent circuits as described in FIGS. 3a and 3b. The multi-layer structures increase the values of the parallel capacitors in the equivalent circuits. The coupled lines are formed by spiral lines. One capacitor is connected in parallel with two sections of broadside coupled lines. In FIG. 6a, the capacitors are located on the left side of the broadside coupled lines. In FIG. 6b, the capacitors are located below the broadside coupled lines. In order to increase the length of broadside coupled lines for achieving broader frequency bandwidth, balanced ports are formed in other layers and connected by via holes as shown in FIGS. 6a and 6b.

In FIG. 6a, the balun comprises eight vertically stacked dielectric layers 612a–612h. The main surfaces of the first and eighth dielectric layers 612a, 612h are the first and second ground planes for the device as illustrated by slanted lines. These ground planes are formed by a metallic material. A via hole 615a and a first output port 620a are formed on the second dielectric layer 612b. The range of the first output port 620a is from the center to the upper right edge of the main surface. On the seventh dielectric layer 612g is another via hole 615b and a second output port 620b. The range of the second output port 620b is from the center to the upper left edge of the main surface.

The first section of broadside coupled lines are formed on the third and fourth dielectric layers 612c, 612d. The first and second coupled lines 624a, 624b of the first section are fabricated respectively with spiral lines on the right side of the main surfaces of the third and fourth dielectric layers. The first electrode $CP_1$ of a capacitor and an input port 630 are also fabricated on the fourth dielectric layer 612d. The capacitor electrode $CP_1$ is connected to the second coupled line 624b and located on the left side of the first section of broadside coupled lines. One end of the first coupled line 624a is connected to the first output port 620a and the other end is connected to the ground plane 612a through the via hole 615a.

Similar to the first section of broadside coupled lines, the first and second coupled lines 626a, 626b of the second section are fabricated respectively with spiral lines on the right side of the main surfaces of the sixth and fifth dielectric layers 612f, 612e. The second electrode $CP_2$ of a capacitor is also fabricated on the fifth dielectric layer 612e. The capacitor electrode $CP_2$ is connected to the second coupled line 626b and located on the left side of the second section of broadside coupled lines. One end of the first coupled line 626a is connected to the second output port 620b and the other end is connected to the ground plane 612h through the via hole 615b. Although the capacitor formed by $CP_1$ and $CP_2$ is located on the left side of the first and second sections of broadside coupled lines in the embodiment illustrated in FIG. 6a, it can also be located on the right side in practice.

The balun structure shown in FIG. 6b comprises eleven dielectric layers 642a–642k because the two capacitor electrodes $CP_1$ and $CP_2$ are formed in separate dielectric layers below the first and second sections of broadside coupled lines. The main surfaces of the first and eleventh dielectric layers 642a, 642k are the first and second ground planes for the device as illustrated by slanted lines. A third ground plane with two via holes is formed on the eighth dielectric layer 642h. The first section of broadside coupled lines are formed with first and second spiral lines 624a, 624b on the third and fourth dielectric layers 642c, 642d respectively. The second section of broadside coupled lines are formed with first and second spiral lines 626a, 626b on the sixth and fifth dielectric layers 642f, 642d respectively.

The first and second output ports 620a, 620b are formed on the second and seventh dielectric layers 642b, 642g respectively. The two capacitor electrodes $CP_1$ and $CP_2$ that are connected respectively to the spiral lines 626b and 624b through via holes on the eighth dielectric layer 642h are formed on the ninth and tenth dielectric layers 642i, 642j. As can be seen in FIG. 6b, the spiral line 624a has one end connected to the first output port 620a and the other end connected to the first ground plane on the first dielectric layer 642a. Similarly, the spiral line 626a has one end connected to the second output port 620b and the other end connected to the third ground plane on the eighth dielectric layer 642h. Although the capacitor formed by $CP_1$ and $CP_2$ is located below the first and second broadside coupled lines in the embodiment illustrated in FIG. 6b, it can also be located above the first and second sections of broadside coupled lines in practice.

Figure 7:
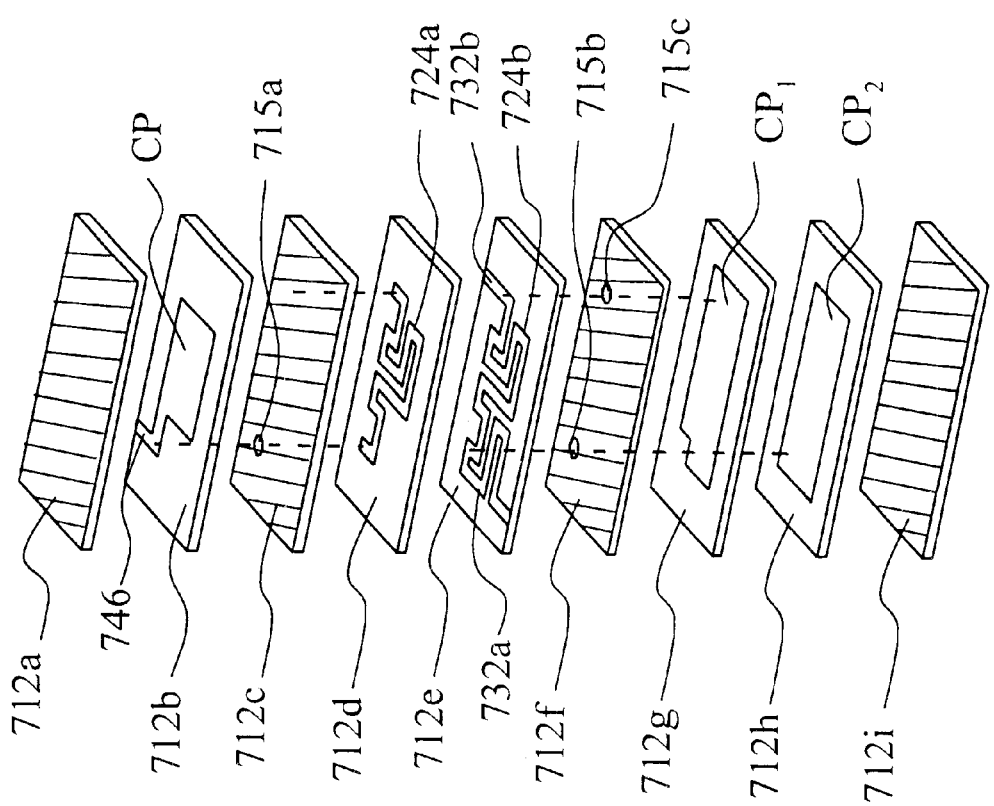

FIG. 7 illustrates a multi-layer device structure for baluns having equivalent circuits as described in FIGS. 4a and 4b. The balun shown in FIG. 7 comprises nine dielectric layers 712a–712i stacked vertically. The main surfaces of the first and ninth dielectric layers 712a, 712i are the first and second ground planes for the device as illustrated by slanted lines. The capacitor electrode CP of a first capacitor is fabricated on a main surface of the second dielectric layer 712b. The first and second capacitor electrodes $CP_1$, $CP_2$ of a second capacitor are fabricated on the main surfaces of the seventh and eighth dielectric layers 712g, 712h respectively.

A section of broadside coupled lines comprises a first spiral line 724a and a second spiral line 724b formed on the main surfaces of the fourth and fifth dielectric layers 712d, 712e respectively. Transmission lines 732a, 732b are formed on the main surface of the fifth dielectric layer 712e and the transmission line 746 is formed on the main surface of the second dielectric layer 712b. It should be noted that the transmission line 411b shown in FIG. 4a can be omitted in realization.

Between the section of broadside coupled lines and the capacitors are the third and fourth ground planes formed on the third and sixth dielectric layers 712c, 712f. A via hole 715a is formed on the main surface of the third dielectric layer 712c and two via holes 715b and 715c are formed on the main surface of the sixth dielectric layer 712f.

In the present invention, the preferred material for forming the coupled lines, transmission lines or ground planes is a low loss metallic material such as Ag, Pd, Cu, Au, or Ni. Assuming a ceramic dielectric constant $\epsilon_r$=7.8 and a center frequency $f_0$=2.44 GHz, the operating efficiency of the baluns of this invention are analyzed based on the multi-layer circuit structures shown in FIGS. 3a and 4a. The characteristics for the return loss $|S_{11}|$ as well as the insertion losses $|S_{21}|$ and $|S_{31}|$ are measured and shown in FIGS. 8a and 9a for the circuits of FIGS. 3a and 4a respectively. In the figures, the vertical axis is the magnitude of the measured loss in dB. The horizontal axis shows the operating frequency of the balun from 2 to 3 GHz.

Figure 8A:
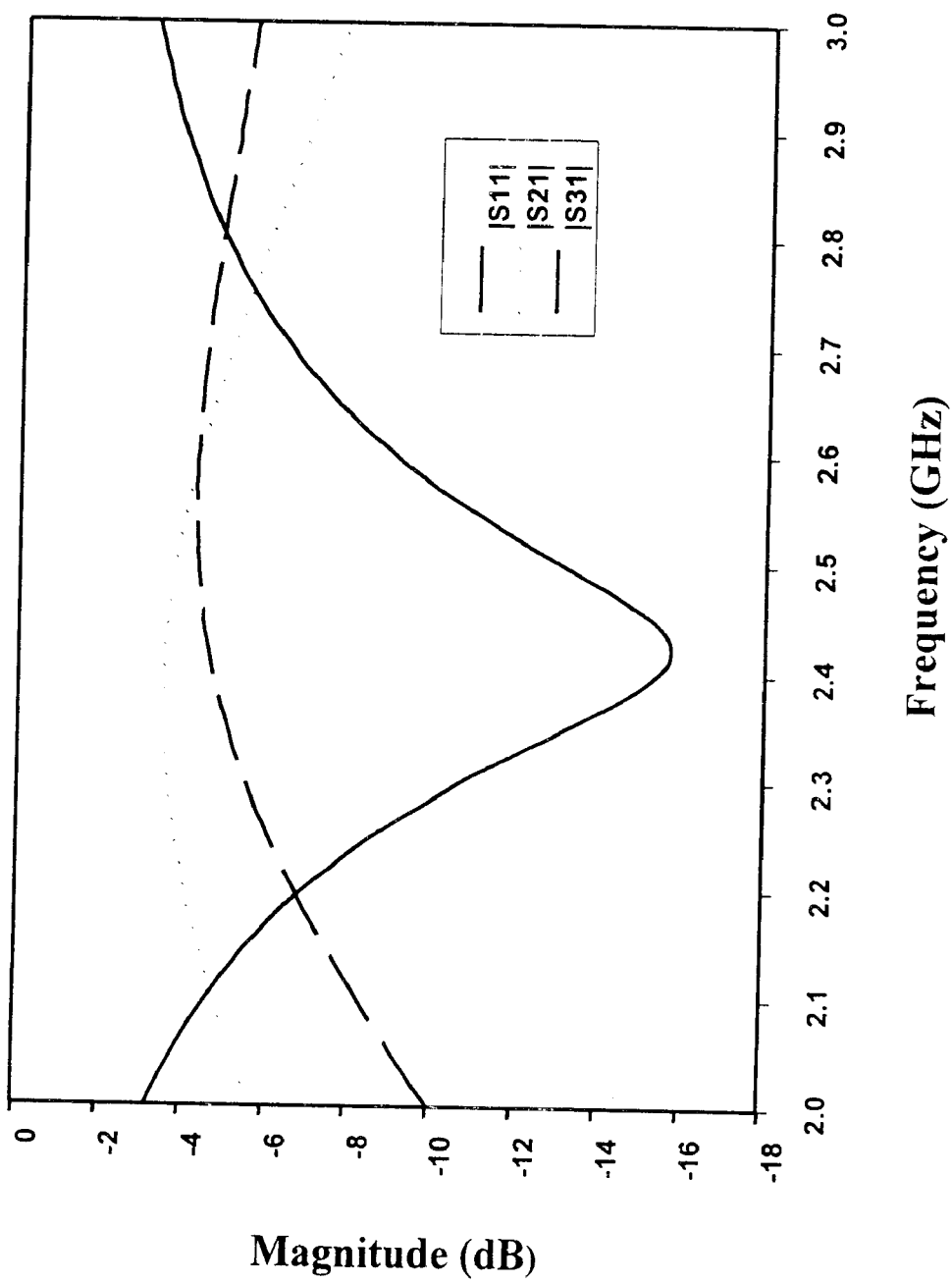
Figure 9A:
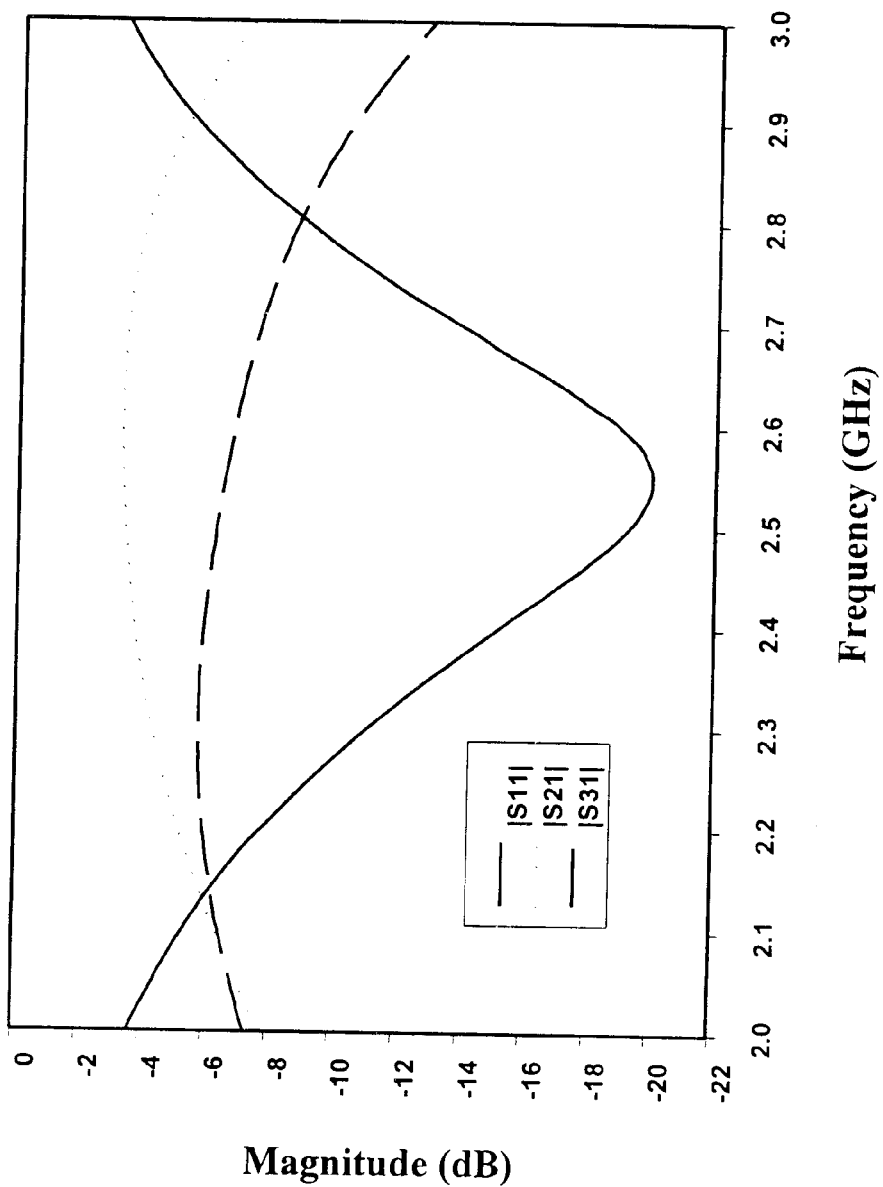

In a high frequency circuit, the measured voltage and current are fluctuated like waves whose values may vary with locations. To characterize a circuit using the scattering parameter (S parameter), the impedance characteristic of the transmission line connected to each port has to be preset. The return loss $|S_{11}|$ should be less than −10 dB in the designed frequency range, i.e., 2.34–2.54 GHz. As can be seen from FIGS. 8a and 9a, the return loss is less than −10 dB which means that the balun has good impedance match and the energy loss is very small. As far as the insertion losses $|S_{21}|$ and $|S_{31}|$, the energy should be distributed equally in the two ports with some loss due to the material. The loss shown in FIGS. 8a and 9a is less than −3 dB which indicates that the energy has been equally distributed and the balanced ports receive most of the energy.

Figure 8B:
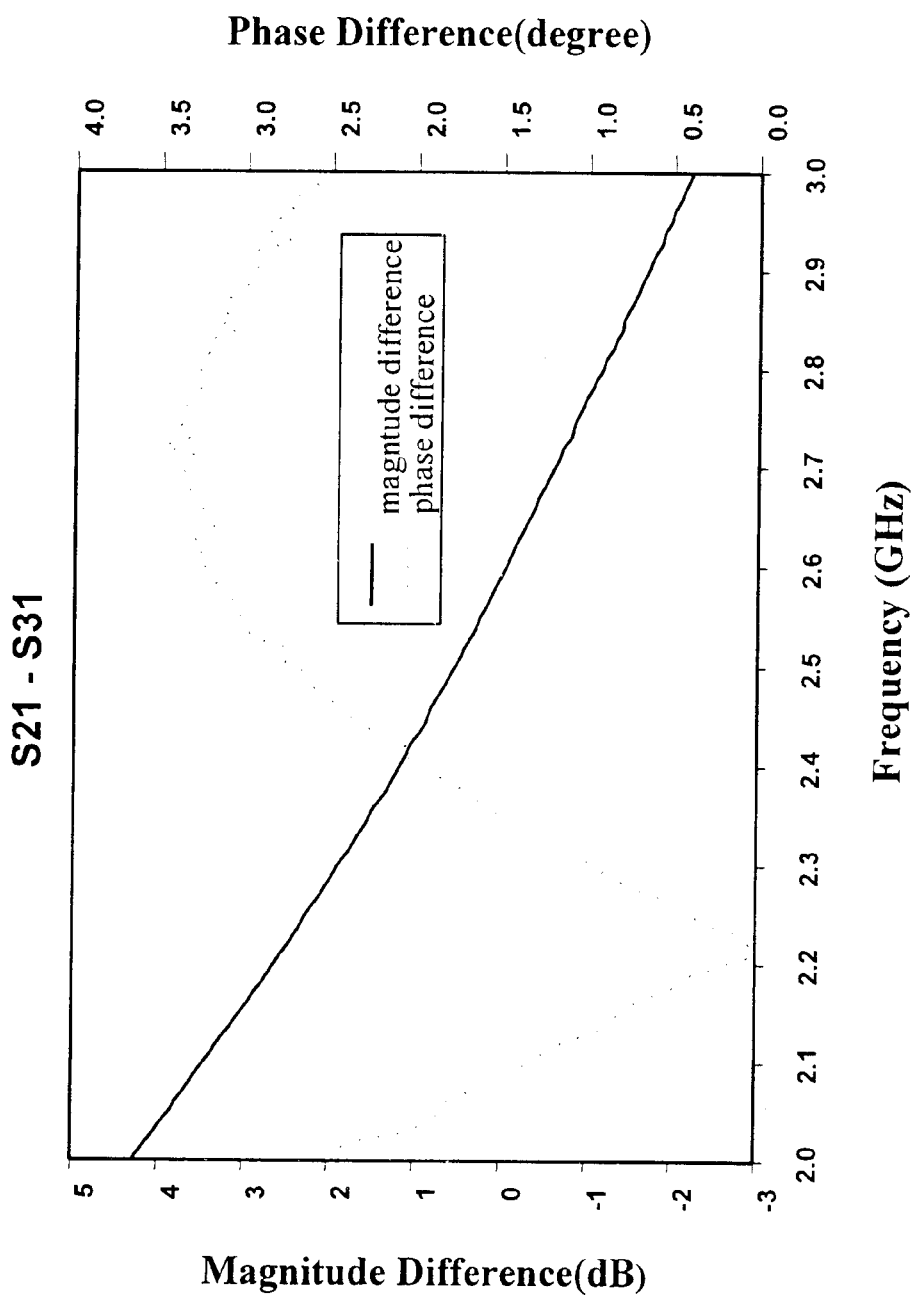
Figure 9B:
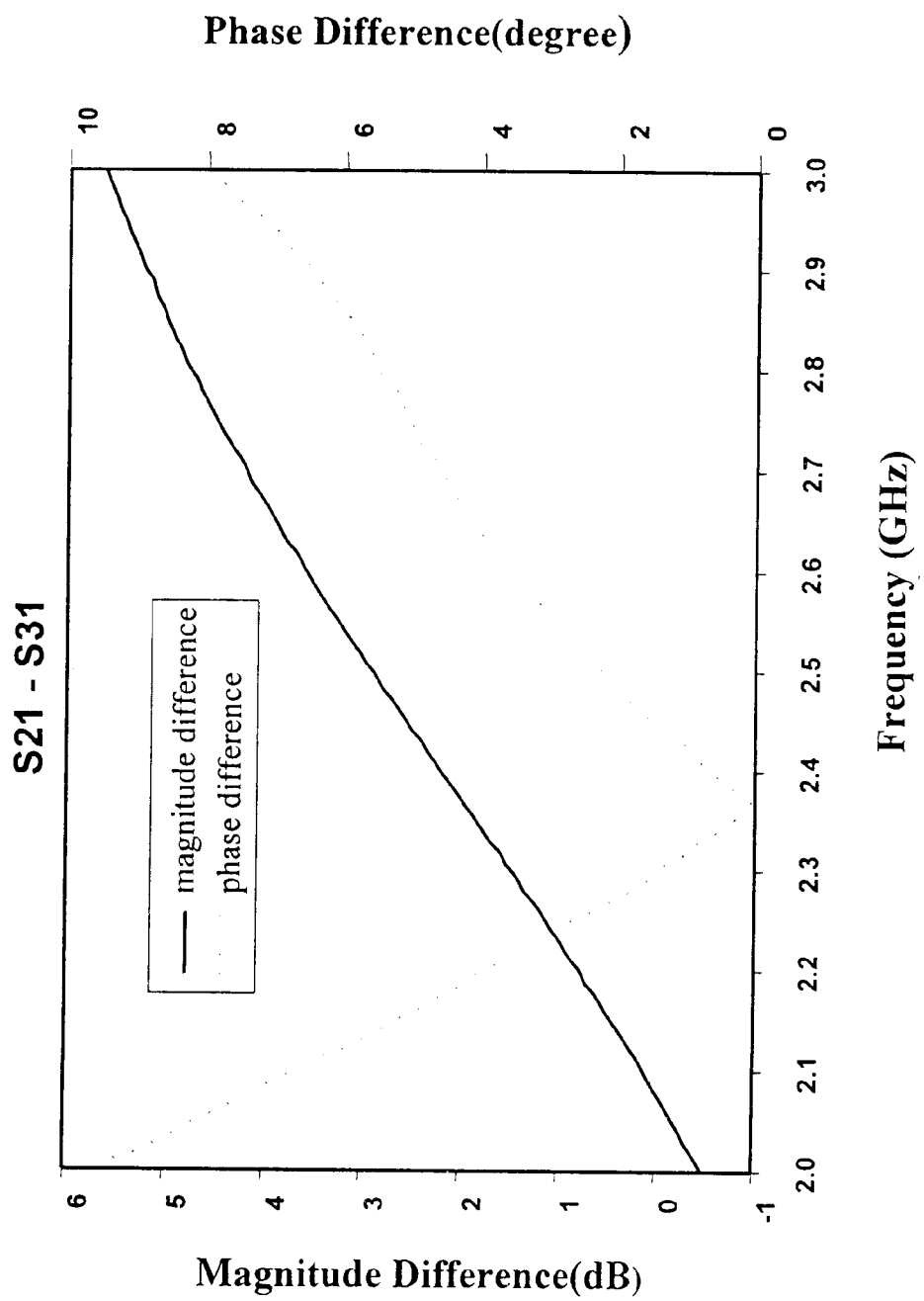

FIGS. 8b and 9b show the measured differences in magnitude and phase within the operating frequency range for the two circuits. The horizontal axis is the operating frequency of the balun in GHz. The vertical axis shows the differences in degree and dB for phase and magnitude respectively. As can be seen, within an operating frequency range 200 MHz, the magnitude difference is less than 2 dB and the phase difference is less than 5 degrees.

According to the multi-layer LC resonance balun of the invention, the drawbacks of the conventional baluns have been overcome. The size of the device has been significantly reduced and the operating frequency bandwidth is increased. The device can be fabricated by materials with a low dielectric constant. In addition to the reduction in cost, the stability of the device is also improved. Therefore, the baluns of this invention can be fabricated with a micro-chip size and suitably used in a wireless network or personal communication.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An LC resonance balun comprising:

a transmission line having first and second ends;

a capacitor having first and second ends;

a first group of at least one section of coupled lines, each section having first and second coupled lines, the first coupled line of each section being connected in series between said first end of said transmission line and said first end of said capacitor, the second coupled line of each section being connected in series between a first output port and ground;

a second group of at least one section of coupled lines, each section having first and second coupled lines, the first coupled line of each section being connected in series between said second end of said transmission line and said second end of said capacitor, the second coupled line of each section being connected in series between a second output port and ground; and an input port connected to said second end of said capacitor.

2. The LC resonance balun as claimed in claim 1, wherein said capacitor is further connected in parallel with at least a capacitor.

3. The LC resonance balun as claimed in claim 1, wherein each of said coupled lines of a section has a shape of a spiral line, meandered line, a sinusoidal line or saw-tooth line.

4. The LC resonance balun as claimed in claim 1, wherein each of said coupled lines of a section is made of a low loss metal.

5. The LC resonance balun as claimed in claim 1, wherein said transmission line is made of a low loss metal.

6. The LC resonance balun as claimed in claim 1, wherein said balun is formed by a multi-layer dielectric structure.

7. The LC resonance balun as claimed in claim 6, said multi-layer dielectric structure having at least seven vertically stacked dielectric layers comprising:

a first dielectric layer having a main surface formed with a ground plane;

a second dielectric layer having a main surface formed with said first output port and a first via hole;

a third dielectric layer having a main surface formed with the first coupled line of said at least one section of coupled lines of said first group;

a fourth dielectric layer having a main surface formed with a first capacitor electrode of said capacitor and the second coupled line of said at least one section of coupled lines of said first group and said input port;

a fifth dielectric layer having a main surface formed with a second capacitor electrode of said capacitor and the second coupled line of said at least one section of coupled lines of said second group;

a sixth dielectric layer having a main surface formed with the first coupled line of said at least one section of coupled lines of said second group;

a seventh dielectric layer having a main surface formed with said second output port and a second via hole; and a bottom ground plane.

8. The LC resonance balun as claimed in claim 7, wherein said first output port is extended from the center of the main surface of said second dielectric layer towards an upper right edge, said first coupled line on said third dielectric layer is formed on the right side of the main surface of said third dielectric layer, said first capacitor electrode and said second coupled line on said fourth dielectric layer are formed respectively on the left and right sides of the main surface of said fourth dielectric layer, said second capacitor electrode and said second coupled line on said fifth dielectric layer are formed respectively on the left and right sides of the main surface of said fifth dielectric layer, said first coupled line on said sixth dielectric layer is formed on the right side of the main surface of said sixth dielectric layer, and said second output port is extended from the center of the main surface of said seventh dielectric layer towards an upper left edge.

9. The LC resonance balun as claimed in claim 7, wherein said first output port is extended from the center of the main surface of said second dielectric layer towards an upper left edge, said first coupled line on said third dielectric layer is formed on the left side of the main surface of said third dielectric layer, said first capacitor electrode and said second coupled line on said fourth dielectric layer are formed respectively on the right and left sides of the main surface of said fourth dielectric layer, said second capacitor electrode and said second coupled line on said fifth dielectric layer are formed respectively on the right and left sides of the main surface of said fifth dielectric layer, said first coupled line on said sixth dielectric layer is formed on the left side of the main surface of said sixth dielectric layer, and said second output port is extended from the center of the main surface of said seventh dielectric layer towards an upper right edge.

10. The LC resonance balun as claimed in claim 6, said multi-layer dielectric structure having at least ten vertically stacked dielectric layers comprising:
   a first dielectric layer having a main surface formed with a ground plane;
   a second dielectric layer having a main surface formed with said first output port;
   a third dielectric layer having a main surface formed with the first coupled line of said at least one section of coupled lines of said first group;
   a fourth dielectric layer having a main surface formed with the second coupled line of said at least one section of coupled lines of said first group and said input port;
   a fifth dielectric layer having a main surface formed with the second coupled line of said at least one section of coupled lines of said second group;
   a sixth dielectric layer having a main surface formed with the first coupled line of said at least one section of coupled lines of said second group;
   a seventh dielectric layer having a main surface formed with said second output port;
   an eighth dielectric layer having a main surface formed with a ground plane and at least two via holes;
   a ninth dielectric layer having a main surface formed with a first capacitor electrode of said capacitor;
   a tenth dielectric having a main surface formed with a second capacitor electrode of said capacitor; and
   a bottom ground plane.

11. The LC resonance balun as claimed in claim 10, wherein said first output port is extended from the center of the main surface of said second dielectric layer towards an upper right edge, said first coupled line on said third dielectric layer is a spiral line extending outwards from the center on the main surface of said third dielectric layer, said second coupled line on said fourth dielectric layer is a spiral line extending outwards from the center on the main surface of said fourth dielectric layer, said second coupled line on said fifth dielectric layer is a spiral line extending outwards from the center on the main surface of said fifth dielectric layer, said first coupled line on said sixth dielectric layer is a spiral line extending outwards from the center on the main surface of said sixth dielectric layer, and said second output port is extended from the center of the main surface of said seventh dielectric layer towards an upper left edge.

12. The LC resonance balun as claimed in claim 6, said multi-layer dielectric structure having at least ten vertically stacked dielectric layers comprising:
   a first dielectric layer having a main surface formed with a ground plane;
   a second dielectric layer having a main surface formed with a first capacitor electrode of said capacitor;
   a third dielectric layer having a main surface formed with a second capacitor electrode of said capacitor;
   a fourth dielectric layer having a main surface formed with a ground plane and at least two via holes;
   a fifth dielectric layer having a main surface formed with said first output port;
   a sixth dielectric layer having a main surface formed with the first coupled line of said at least one section of coupled lines of said first group;
   a seventh dielectric layer having a main surface formed with the second coupled line of said at least one section of coupled lines of said first group and said input port;
   an eighth dielectric layer having a main surface formed with the second coupled line of said at least one section of coupled lines of said second group;
   a nine dielectric layer having a main surface formed with the first coupled line of said at least one section of coupled lines of said second group;
   a ten dielectric layer having a main surface formed with said second output port; and
   a bottom ground plane.

13. An LC resonance balun comprising:
   a first capacitor having first and second ends;
   a first transmission line having a first end connected to a first output port and a second end connected to said first end of said first capacitor;
   a second transmission line having a first end connected to a second output port and a second end connected to said second end of said first capacitor;
   a second capacitor having first and second ends;
   a third transmission line having a first end connected to an input port and a second end connected to said first end of said second capacitor;
   a fourth transmission line having a first end connected to ground and a second end connected to said second end of said second capacitor; and
   at least one section of coupled lines, each section having first and second coupled lines, the first coupled line of each section being connected in series between said second end of said first transmission line and said second end of said second transmission line, the second coupled line of each section being connected in series between said second end of said third transmission line and said second end of said fourth transmission line.

14. The LC resonance balun as claimed in claim 13, wherein said first capacitor is further connected in parallel with at least a capacitor.

15. The LC resonance balun as claimed in claim 13, wherein said second capacitor is further connected in parallel with at least a capacitor.

16. The LC resonance balun as claimed in claim 13, wherein each of said coupled lines of a section has a shape of a spiral line, meandered line, sinusoidal line or saw-tooth line.

17. The LC resonance balun as claimed in claim 13, wherein each of said coupled lines of a section is made of a low loss metal.

18. The LC resonance balun as claimed in claim 13, wherein said transmission line is made of a low loss metal.

19. The LC resonance balun as claimed in claim 13, wherein said balun is formed by a multi-layer dielectric structure.

20. The LC resonance balun as claimed in claim 19, said multi-layer dielectric structure having at least eight vertically stacked dielectric layers comprising:

a first dielectric layer having a main surface formed with a ground plane;

a second dielectric layer having a main surface formed with a capacitor electrode said second capacitor;

a third dielectric layer having a main surface formed with a ground plane and at least two via holes;

a fourth dielectric layer having a main surface formed with the first coupled line of said at least one section of coupled lines;

a fifth dielectric layer having a main surface formed with the second coupled line of said at least one section of coupled lines;

a sixth dielectric layer having a main surface formed with a ground plane and at least a via hole;

a seventh dielectric layer having a main surface formed with a first capacitor electrode of said first capacitor;

an eighth dielectric layer having a main surface formed with a second capacitor electrode of said first capacitor; and a bottom ground plane.

21. The LC resonance balun as claimed in claim 20, wherein the first coupled line of said at least one section of coupled lines is extended outwards from the center of the main surface of a dielectric layer, and the second coupled line of said at least one section of coupled lines is extended outwards from the center of the main surface of a dielectric layer.

* * * * *